US008927430B2

(12) United States Patent
Bruce et al.

(10) Patent No.: US 8,927,430 B2
(45) Date of Patent: Jan. 6, 2015

(54) OVERBURDEN REMOVAL FOR PORE FILL INTEGRATION APPROACH

(75) Inventors: Robert L. Bruce, White Plains, NY (US); Geraud Jean-Michel Dubois, San Jose, CA (US); Theo J. Frot, Los Gatos, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 13/180,710

(22) Filed: Jul. 12, 2011

(65) Prior Publication Data

US 2013/0017682 A1    Jan. 17, 2013

(51) Int. Cl.
| H01L 21/302 | (2006.01) |
| H01L 21/768 | (2006.01) |
| H01L 21/3105 | (2006.01) |
| H01L 21/02 | (2006.01) |

(52) U.S. Cl.
CPC ...... *H01L 21/3105* (2013.01); *H01L 21/76822* (2013.01); *H01L 2221/1047* (2013.01); *H01L 21/7682* (2013.01); *H01L 21/02203* (2013.01); *H01L 21/76828* (2013.01)
USPC ............. 438/694; 438/745; 438/787; 216/56; 216/83

(58) Field of Classification Search
None
See application file for complete search history.

(56) References Cited

U.S. PATENT DOCUMENTS

| 5,895,263 A | 4/1999 | Carter et al. ............... 438/624 |
| 6,318,124 B1 * | 11/2001 | Rutherford et al. ............ 65/60.8 |
| 6,399,666 B1 | 6/2002 | Hawker et al. ............... 521/77 |
| 6,451,712 B1 | 9/2002 | Dalton et al. ............... 438/781 |
| 6,528,409 B1 * | 3/2003 | Lopatin et al. ............... 438/618 |
| 6,703,324 B2 * | 3/2004 | Wong ............................ 438/787 |
| 6,800,330 B2 | 10/2004 | Hayashi et al. ............... 427/387 |
| 6,893,985 B2 | 5/2005 | Goodner ....................... 438/795 |
| 6,924,222 B2 | 8/2005 | Goodner et al. ............. 438/622 |
| 7,071,091 B2 | 7/2006 | Clarke et al. ............... 438/622 |
| 7,229,934 B2 | 6/2007 | Dubois et al. ............... 438/781 |
| 7,265,437 B2 | 9/2007 | Nguyen et al. ............... 257/637 |
| 7,282,458 B2 | 10/2007 | Gates et al. ................. 438/778 |
| 7,288,292 B2 | 10/2007 | Gates et al. ................. 427/489 |
| 7,303,989 B2 | 12/2007 | Boyanov et al. ............. 438/637 |
| 7,312,524 B2 | 12/2007 | Gates et al. ................. 257/701 |
| 7,399,715 B2 | 7/2008 | Tsuchiya et al. ............. 438/781 |
| 7,422,975 B2 | 9/2008 | Nogami et al. ............... 438/619 |
| 7,462,678 B2 | 12/2008 | Akiyama et al. ............. 528/14 |
| 7,479,306 B2 | 1/2009 | Edelstein et al. ............ 427/447 |

(Continued)

OTHER PUBLICATIONS

Frot, T. et al "Application of the Protection/Deprotection Strategy to the Science of Porous Materials" Adv. Mater. 23, 2828-2832, 2011, published online Apr. 29, 2011.*

(Continued)

*Primary Examiner* — Anita Alanko
(74) *Attorney, Agent, or Firm* — Harrington & Smith

(57) ABSTRACT

In one exemplary embodiment of the invention, a method includes: providing a structure having a first layer overlying a substrate, where the first layer includes a dielectric material having a plurality of pores; applying a filling material to a surface of the first layer; after applying the filling material, heating the structure to enable the filling material to at least partially fill the plurality of pores, where heating the structure results in residual filling material being left on the surface of the first layer; and after heating the structure, removing the residual filling material by applying a solvent wash.

16 Claims, 10 Drawing Sheets

(56) References Cited

U.S. PATENT DOCUMENTS

| | | | |
|---|---|---|---|
| 7,510,982 B1 | 3/2009 | Draeger et al. | 438/783 |
| 7,629,272 B2 | 12/2009 | Waldfried et al. | 438/781 |
| 8,603,705 B2* | 12/2013 | Aiyar et al. | 430/3 |
| 2006/0024849 A1 | 2/2006 | Zhu et al. | 438/12 |
| 2006/0046044 A1 | 3/2006 | Lee et al. | |
| 2006/0246303 A1 | 11/2006 | Aoki et al. | |
| 2007/0077782 A1 | 4/2007 | Lee et al. | 438/781 |
| 2007/0111535 A1* | 5/2007 | Yu et al. | 438/758 |
| 2007/0184222 A1 | 8/2007 | Delouise et al. | |
| 2008/0009141 A1 | 1/2008 | Dubois et al. | 438/758 |
| 2009/0140418 A1 | 6/2009 | Li et al. | 257/734 |
| 2009/0206453 A1* | 8/2009 | Fujii et al. | 257/632 |
| 2009/0317971 A1 | 12/2009 | Cui et al. | 438/618 |
| 2010/0165449 A1 | 7/2010 | Hakii | |
| 2010/0289143 A1* | 11/2010 | Cho et al. | 257/741 |

OTHER PUBLICATIONS

Ryu et al "A Generalized Approach to the Modification of Solid Surfaces" Science 308, 236-239, Apr. 8, 2005.*

"The structure of poly(cyano-p-xylylene):" Park, S.-Y.; Blackwell, J.; Chvalun, S.N.; Nikolaev, A.A.; Mailyan, K.A.; Pebalk, A.V.; Kardash, I.E.; Jul. 22, 1998 (9 pages).

"Infiltrating Semiconducting Polymers into Self-Assembled Mesoporous Titania Films for Photovoltaic Applications", Kevin M. Coakley, et al., Advanced Functional Materials, vol. 13, No. 4, Apr. 2003, p. 301-306.

"Homogeneous Porous Low Dielectric Constant Materials", U.S. Appl. No. 13/010,004, filed Jan. 20, 2011, 50 pgs.

Kropka et al., "Control of Interfacial Instabilities in Thin Polymer Films with the Addition of a Miscible Component", American Chemical Society, (2006), (pp. 8758-8762), published on web Nov. 17, 2006.

Barnes, et al., "Suppression of Dewetting in Nanoparticle-Filled Polymer Films", American Chemical Society, (2000), (pp. 4177-4185), published on web May 3, 2000.

Choi, et al., "Suppress Polystyrene Thin Film Dewetting by Modifying Substrate Surface with Aminopropylthriethoxysilance", Science Direct, (2006), (pp. 1391-1404), available online Feb. 20, 2006.

Luzinov, et al., "Thermoplastic Elastomer Monolayers Grafted to a Functionalized Silicon Surface", American Chemical Society, (2000), (pp. 7629-7638), published on the web Sep. 14, 2000.

Mackay, et al., "Influence of Dendrimer Additives on the Dewetting of Thin Polystyrene Films", American Chemical Society, (2002), (pp. 1877-1882), published on the web Feb. 1, 2002.

Ryu, et al., "A Generalized Approach to the Modification of Solid Surfaces", vol. 308 (Apr. 8, 2005), (pp. 236-239).

* cited by examiner (A)

| ρ | t (nm) |
|---|---|
| 0.98 | 530 |

(B)

| Row | ρ | t (nm) | Fill |
|---|---|---|---|
| 1 | 1.05 | 16 | |
| 2 | 1.29 | 387 | 0.89 |
| 3 | 1.26 | 108 | 0.81 |
| 4 | 1.02 | 30 | 0.10 |

(C)

| Row | ρ | t (nm) | Fill |
|---|---|---|---|
| 1 | | | |
| 2 | 1.28 | 407 | 0.84 |
| 3 | 1.26 | 116 | 0.80 |
| 4 | 1.05 | 6 | 0.20 |

FIG. 14

OVERBURDEN REMOVAL FOR PORE FILL INTEGRATION APPROACH

TECHNICAL FIELD

The exemplary embodiments of this invention relate generally to semiconductor devices and, more specifically, relate to porous dielectric materials.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

It is widely known that the speed of propagation of interconnect signals is one of the most important factors controlling overall circuit speed as feature sizes are reduced and the number of devices per unit area increases. Throughout the semiconductor industry, there is a strong drive to reduce the dielectric constant (k) of the interlayer dielectric (ILD) materials such as those existing between metal lines, for example. As a result of such reduction, interconnect signals travel faster through conductors due to a concomitant reduction in resistance-capacitance (RC) delays.

Porous ultra low-k (ULK) dielectrics have enabled capacitance reduction in advanced silicon complementary metal-oxide semiconductor (CMOS) back end of line (BEOL) structures. However, the high level of porosity required (e.g., to achieve k values of 2.4 and lower) create issues in terms of dielectric material damage or loss due to plasma exposures (e.g., reactive ion etch (RIE), strip, dielectric barrier etch) and wet cleans (e.g., post RIE dilute hydrofluoric acid (DHF) cleans). Additionally, penetration of metals used in the liner layer (e.g., Ta, TaN) or the seed layer (e.g., Cu, Ru) into the pores of the dielectric can occur when porosity is high and the material is characterized by a high degree of pore connectivity. This leads to degradation of the dielectric breakdown strength and degradation of the leakage characteristics of the dielectric. All of these issues collectively may cause reliability degradation in BEOL structures made using highly porous ULK dielectrics.

Although the design of a low-k dielectric material with desirable properties for implementation is demanding enough, the complexity of modern semiconductor manufacturing processes adds further complications. Some of these are a direct result from trying to utilize $SiO_2$-based processes with porous, low-k dielectric materials that are considerably less forgiving. In this regard, adding porosity may not result in redeeming values (e.g., improved characteristics) other than lowering the dielectric constant. Critical damage to the low dielectric porous material can occur at different stages of the integration process, including: hard-mask deposition, reactive ion etch, photoresist strip, liner deposition, chemical mechanical polishing, and cap deposition, as non-limiting examples.

BRIEF SUMMARY

In one exemplary embodiment of the invention, a method comprising: providing a structure comprising a first layer overlying a substrate, where the first layer comprises a dielectric material having a plurality of pores; applying a filling material to a surface of the first layer; after applying the filling material, heating the structure to enable the filling material to at least partially fill the plurality of pores, where heating the structure results in residual filling material being left on the surface of the first layer; and after heating the structure, removing the residual filling material by applying a solvent wash.

In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores; applying a filling material to a surface of the first layer; after applying the filling material, heating the structure to enable the filling material to at least partially fill the plurality of pores, where heating the structure results in residual filling material being left on the surface of the first layer; and after heating the structure, removing the residual filling material by applying a solvent wash.

In a further exemplary embodiment of the invention, a method comprising: providing a structure comprising a first layer overlying a substrate, where the first layer comprises a dielectric material having a plurality of pores, where the dielectric material has a dielectric constant (k) less than or equal to 2.4; applying a filling material to a surface of the first layer; after applying the filling material, heating the structure to enable the filling material to at least partially fill the plurality of pores, where heating the structure results in residual filling material being left on the surface of the first layer; after heating the structure, removing the residual filling material by applying a solvent wash, where the solvent wash does not interact with the first layer, where the solvent has a poor affinity for the first layer, where at least one of a temperature and an exposure time for the application of the solvent wash is controlled to mitigate or avoid erosion of the filling material from the plurality of pores; and after removing the residual filling material by applying the solvent wash, drying the surface of the first layer.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein:

FIG. 14 shows three tables corresponding to data obtained based on the three XRR scans of FIG. 13.

DETAILED DESCRIPTION

One technique for addressing the above-noted issues is to fill the pores of the dielectric with a filling material (e.g., a polymer). One prior art technique, as disclosed by U.S. Pat. No. 6,703,324, introduces a secondary component into the void fraction of a porous medium (low dielectric constant film) in order to temporarily improve the mechanical properties such that the porous film has mechanical characteristics of a much stiffer film. Once a process operation such as a chemical mechanical polishing process, which requires greater mechanical strength than that provided by the porous film alone, is completed, the secondary component is removed by displacement or dissolution. Another prior art technique, as disclosed by U.S. Pat. No. 7,303,989, impregnates the pores of a zeolite low-k dielectric layer with a polymer and forms an interconnect structure therein. This mechanically strengthens the dielectric layer and prevents metal deposits within the pores.

Reference is made to commonly-assigned U.S. patent application Ser. No. 13/010,004, filed Jan. 20, 2011, concerning porous dielectric fill methods, techniques, devices, structures and aspects thereof.

Figure 1:
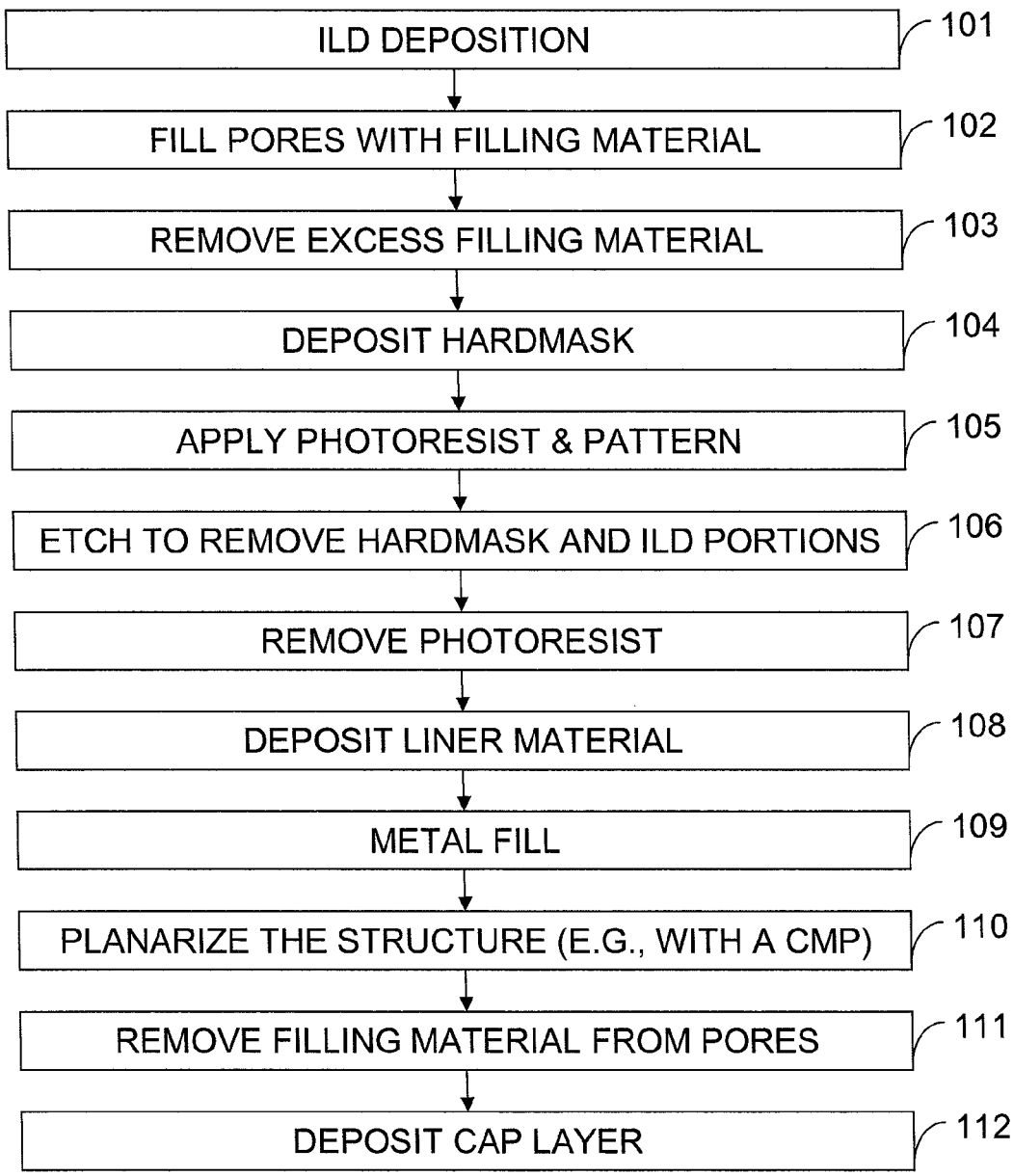
FIG. 1 shows a flowchart illustrating one non-limiting example of a method for practicing the exemplary embodiments of this invention.

Below, and with reference to FIGS. 1-8, is described one, non-limiting exemplary embodiment illustrating how filling the pores of a porous dielectric film (e.g., a low-k or ULK dielectric film) may be beneficial for processing carried out on the wafer. FIG. 1 depicts a flowchart illustrating one non-limiting example of such a method and is further referred to below with reference to FIGS. 2-8. It is noted that the described exemplary method is for forming a single damascene interconnect structure. In other exemplary embodiments, a different structure may be formed and/or utilized (e.g., a dual damascene structure).

Figure 2:
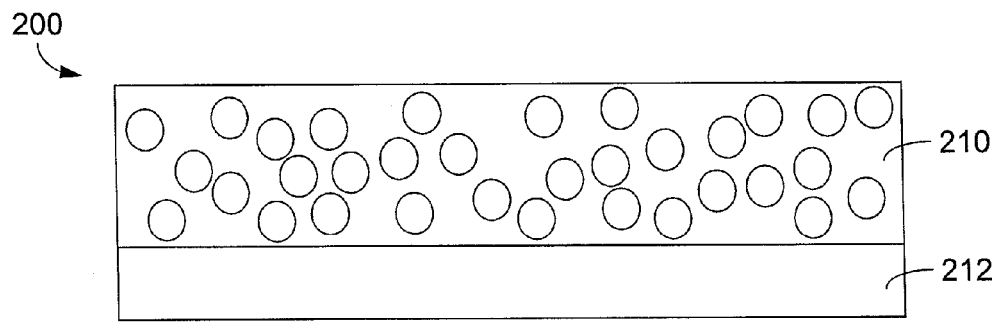
FIGS. 2-8 show a semiconductor wafer at various stages of processing in practicing the exemplary method depicted in FIG. 1.

In FIG. 2 (step 101 of FIG. 1), a semiconductor wafer 200 that has a previous interconnect layer 212 deposited on top is first coated with an ILD layer 210 of a porous material containing empty pores (e.g., an organosilicate), for example, deposited by the best known techniques. As an example, the interconnect layer 212 may be suitably formed of wiring with a high electrical conductivity material (e.g., copper, aluminum, alloys thereof) embedded in a suitable ILD (porous or nonporous) and optionally capped with a diffusion barrier dielectric (e.g., SiN, NBLOK). Detailed make up of layer 212 is omitted in FIGS. 2-8 for purposes of clarity. Subsequent processing and operations may utilize the interconnect layer 212 and the ILD layer 210 to form a single or dual damascene structure, as non-limiting examples.

Figure 3:
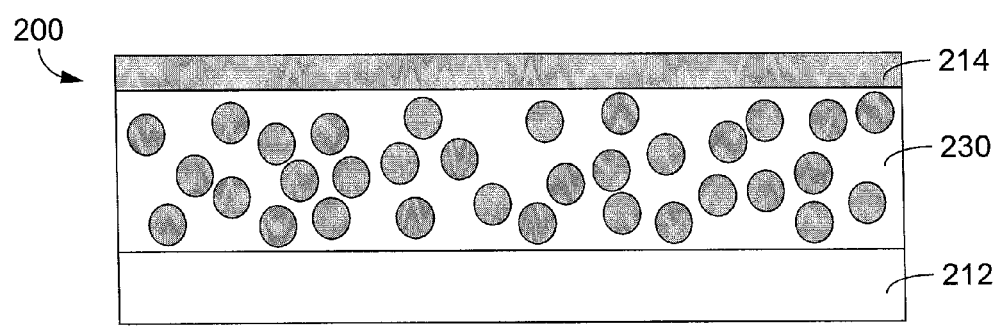

In FIG. 3 (step 102 of FIG. 1), the pores of the porous dielectric are homogeneously filled with a filling material (e.g., an organic polymer 214). There is an excess/residual layer of the organic polymer 214 that forms at the surface of the filled ILD film 230.

Figure 4:
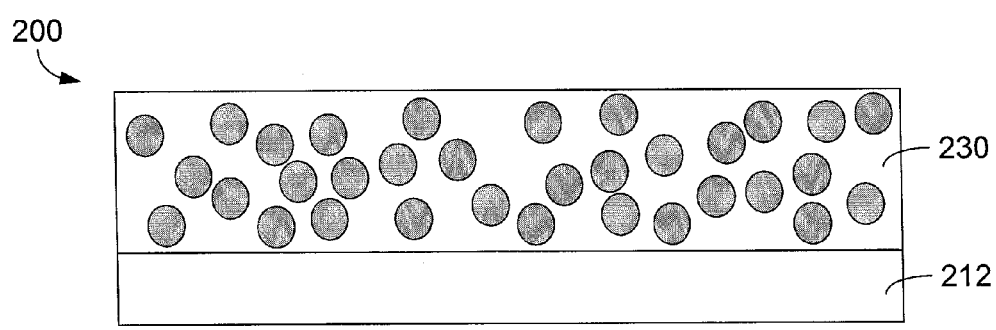

In FIG. 4 (step 103 of FIG. 1), the excess/residual of organic polymer 214 that was deposited on top of the filled ILD film 230 is then removed by a suitable method, such as plasma etch, RIE strip, wet dissolution or gentle polishing. Care should be exercised not to remove the polymer from the filled pores in the structure and not to damage the filled ILD film 230.

Figure 5:
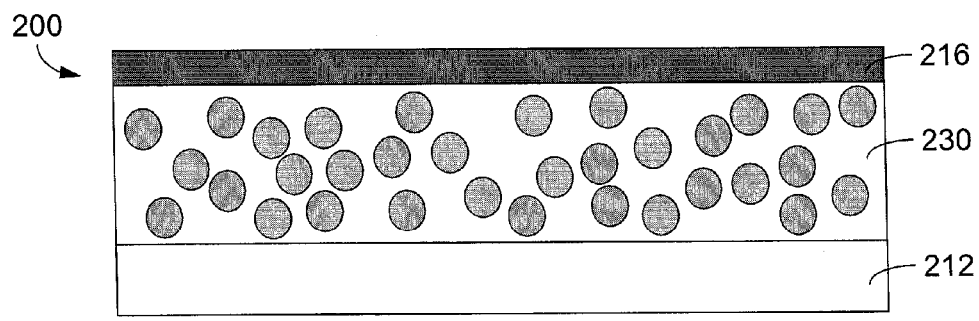

In FIG. 5 (step 104 of FIG. 1), a hardmask layer 216 is deposited on top of the filled ILD layer 230, for example, using plasma enhanced chemical vapor deposition (PECVD) or spin-on techniques. The hardmask 216 can be formed of any suitable material including, as non-limiting examples, $SiO_2$, $Al_2O_3$, SiN, $Si_3N_4$, SiC, SiCOH or another suitable hardmask material as known in the art. The hardmask layer 216 may further be formed by more than one layer of material, though the total thickness preferably should be less than 250 nm and, more preferably, less than 100 nm.

In step 105 of FIG. 1, a photoresist layer is applied to the top of the hardmask layer 216, exposed to generate a desired pattern, developed and then baked (e.g., at a temperature on the order of 200° C. or less).

In step 106 of FIG. 1, the hardmask layer 216 and the filled ILD layer 230 are etched (e.g., in a plasma etching process) to remove them in those regions defined by openings in the photoresist pattern on top of the hardmask layer 216.

In step 107 of FIG. 1, any remnants of the resist layer are removed by a strip process. It should be noted that this is the step where the porosity of the organosilicate is exposed to the strip process chemistry used to remove the photoresist and damage would otherwise occur to the pores of the filled ILD layer 230 if they were not filled with the polymer. Without first filling the pores, after such an exposure the dielectric constant and the leakage current of the ILD increase significantly. In contrast, as the ILD is in a nonporous hybrid state enriched in carbon due to the fill material now present in the original pores, little or no damage occurs to the filled ILD layer 230.

In step 108 of FIG. 1, a liner material is deposited to form a liner layer 222 on top of the hardmask layer 216. The liner layer 222 may be comprised of a material such as TaN, TiN, Ti, Ta, or various combinations thereof, as non-limiting examples, for achieving adhesion and diffusion barrier properties.

At this stage, in some exemplary embodiments a seed layer (e.g., copper) is deposited on top of the liner layer 222. The seed layer may be deposited by sputtering, for example, and may be used to facilitate subsequent electroplating.

In step 109 of FIG. 1, the etched opening is filled with a metal 224, such as copper, for example. The metal may be formed by electroplating, for example, and overfills the opening.

In step 110 of FIG. 1, after the etched opening is filled with the metal 224, the electronic structure 200 is planarized (e.g., by a chemical mechanical polishing (CMP) process) to achieve a planar surface with a metal inlaid structure. In this CMP step, polishing is performed until all of the excess metal, liner and hardmask on top of the filled ILD layer 230 are removed, thus exposing at least a top surface of the filled ILD layer 230.

Figure 6:
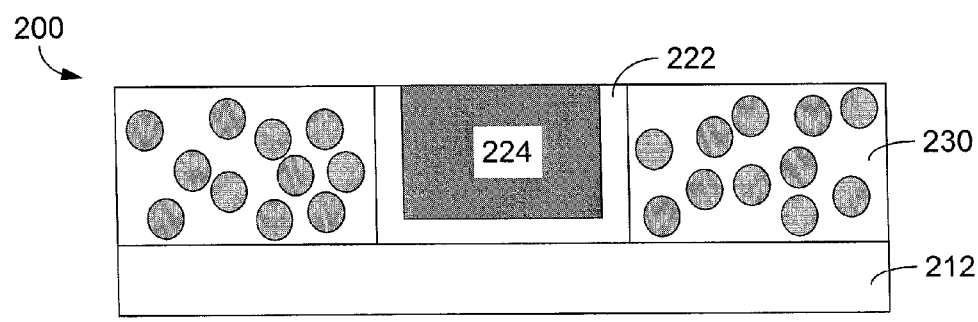

FIG. 6 shows the electronic structure 200 after performance of steps 105-110 noted above.

Figure 7:
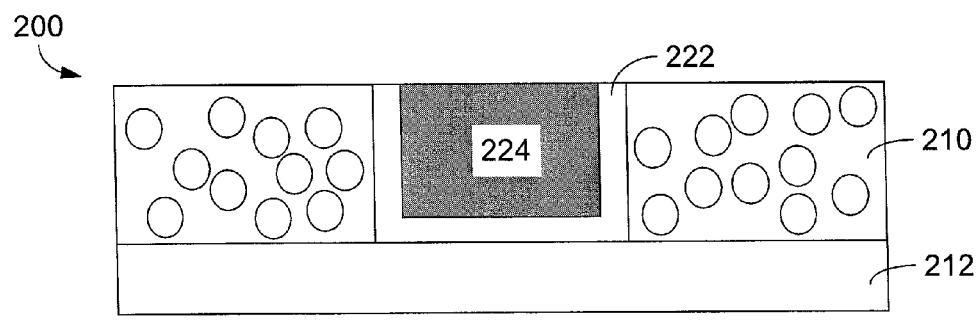

In FIG. 7 (step 111 of FIG. 1), the filling material (e.g., the organic polymer) is removed from the pores, for example, by decomposing it using a thermal curing or a thermal curing assisted by ultraviolet (UV) irradiation, as non-limiting examples.

Figure 8:
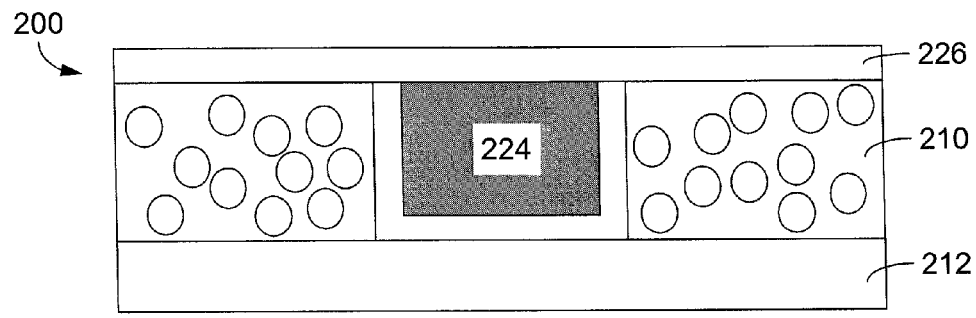

In FIG. 8 (step 112 of FIG. 1), a cap layer 226 of an insulating material (e.g., silicon carbide, silicon nitride, silicon carbonitride, combinations thereof) is deposited on top in order to prevent diffusion of the metal and to protect the electronic device 200 (e.g., from mechanical abrasion or other damage).

As described above, by filling the pores of the porous ILD (e.g., with a polymer, an organosilicate) damage to the ILD (e.g., to the pores of the ILD) can be avoided during processing of the structure. Also as noted above, much of the potential for damage stems from the strip process chemistry used to remove the photoresist. Without filling the pores, the dielectric constant and the leakage current of the ILD may be adversely affected (e.g., significantly increased).

As noted above for step 103 of FIG. 1 (see FIG. 4), the excess/residual filling material (the excess/residual organic polymer 214) that was deposited on top of the filled porous material (ILD film 230) is removed. Complete or substantial removal of the residual filling material may be important in order to form good or proper adhesion of the hardmask to the filled porous material (the filled ILD). However, care should be exercised not to remove the filling material from the filled pores in the structure and not to damage the filled ILD film 230.

Figure 9:
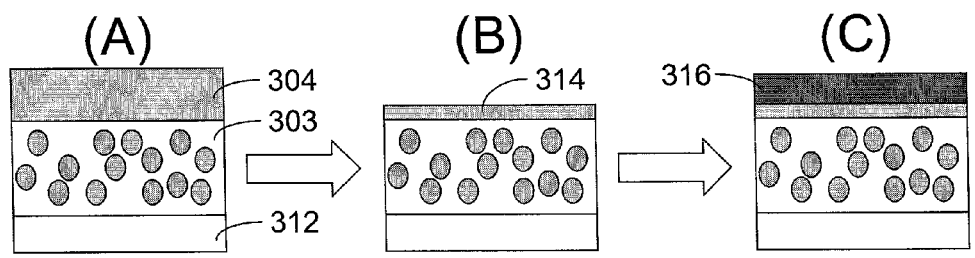
FIGS. 9 and 10 illustrate two situations that can arise from excess/residual filling material remaining on the surface of the dielectric.
Figure 10:
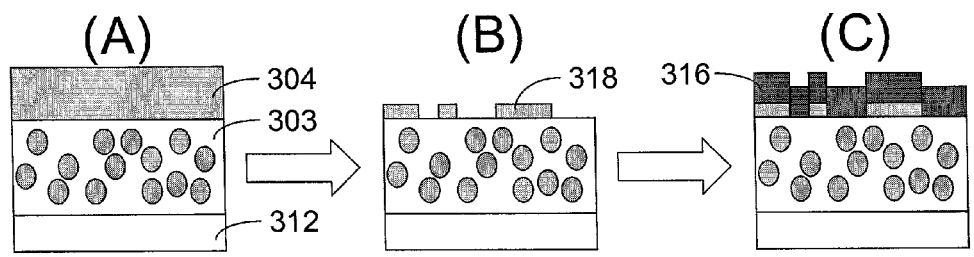

FIGS. 9 and 10 illustrate two situations that can arise from excess/residual filling material remaining on the surface of the dielectric, for example, due to non-removal of the excess or incomplete removal. In FIGS. 9 and 10, a porous low-k dielectric material (e.g., ILD) 303 overlying a substrate 312 has been filled with a filling material (e.g., a polymer) such that an excess of the filling material 304 (e.g., residual filling material 304) is disposed on a surface of the dielectric (see FIGS. 9A and 10A). In FIG. 9, the residual is not removed or is not entirely removed, leaving a thin film 314 on the surface of the dielectric (FIG. 9B). Thus, the hardmask 316 is deposited on the thin film of excess filling material (FIG. 9C). In FIG. 10, the residual material 304 does not comprise a film but rather separate portions (e.g., spots) of the excess material 318 on the surface of the dielectric (FIG. 10B). Thus, the hardmask 316 is deposited over an uneven surface and is itself uneven (FIG. 10C). Both of these situations yield poor adhesion between the hardmask and the underlying filled porous dielectric material, leading the structure to be incompatible with integration.

The exemplary embodiments of the invention address the above-noted issues (and potentially further issues) by providing techniques that enable complete or substantially complete removal of the residual filling material. In one, non-limiting exemplary embodiment (see FIG. 11, described below), a solvent wash is used to remove the residual filling material (e.g., completely or substantially completely).

Figure 11:
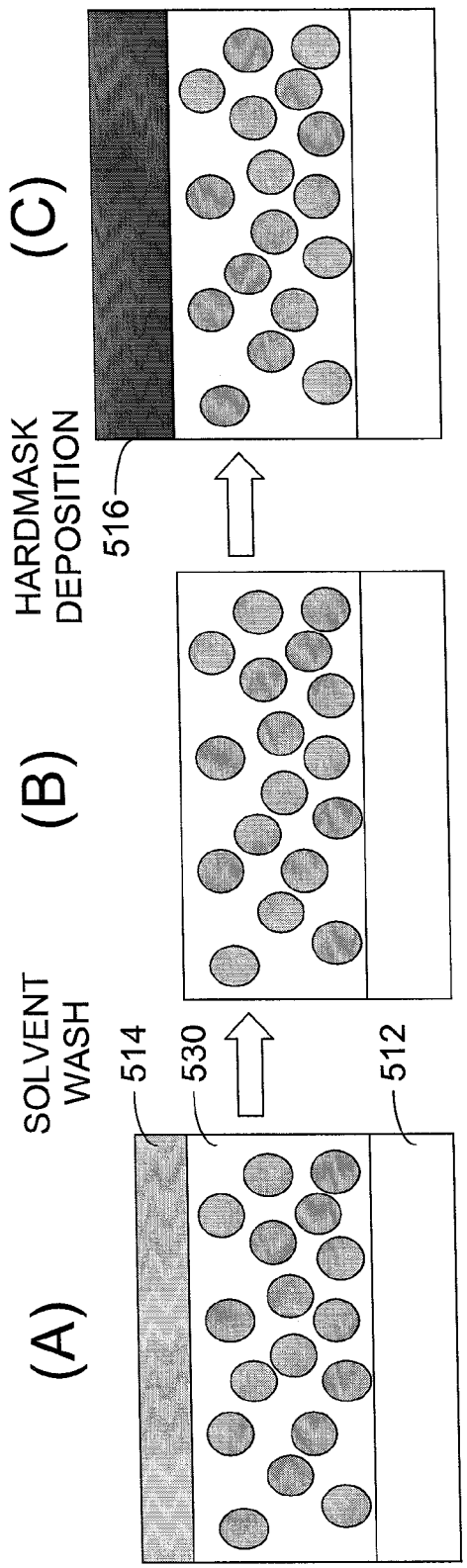
FIG. 11 illustrates a second, non-limiting exemplary embodiment of the invention wherein a solvent wash is used to remove the excess/residual filling material.

In FIG. 11, a porous low-k dielectric material (e.g., ILD) 530 overlying a substrate 512 has been filled with a filling material (e.g., a polymer) such that residual filling material 514 is left (e.g., disposed) on a surface of the dielectric (see FIG. 11A). In this exemplary embodiment, the residual filling material 514 is removed with a solvent wash (see FIG. 11B). A hardmask 516 is deposited on the dielectric 530 after removal of the residual filling material 514 (see FIG. 11C).

FIG. 11 illustrates a non-limiting exemplary embodiment of the invention wherein a solvent wash is used to remove the residual filling material (e.g., completely or substantially completely). This process takes advantage of a difference in solubility between the filling material in the pores and the residual filling material on the surface of the dielectric. Based on this difference, the solvent wash removes the residual filling material without affecting the filled pores. Thus, usage of a solvent wash is a comparatively benign operation (e.g., compared to ash/strip chemistry) since it does not negatively affect the ILD 530.

The difference in solubility is a physical phenomenon. It is based on the difference of accessible surface area between the filling material (e.g., polymer) in the pores and the residual/excess filling material on top of the film. It may be desirable to use a solvent that poorly dissolves the filling material. In such a manner, it will be difficult for the solvent to dissolve the filling material present in the pores. In some exemplary embodiments, the solvent is a theta solvent of the polymer—a solvent in which the polymer is collapsed on itself (the polymer's chains are not spread out) but not insoluble. In further exemplary embodiments, the solvent has a bad or poor affinity for the matrix. In such a manner, the solvent would tend to avoid penetrating the film and removing the polymer from the porosity.

For the solvent wash, temperature and exposure time will affect the results. For example, a longer exposure time may result in erosion of the polymer from the pores. As a further example, a higher temperature may result in erosion of the polymer from the pores. In some exemplary embodiments, a difference in temperature, for example, as obtained by cooling the system (e.g., the wafer, film and/or polymer), may assist in more selectively dissolving the polymer overburden by contrasting it with the polymer in the pores. In further exemplary embodiments, pore size may impact the results (e.g., have an effect on the difference in solubility).

In some exemplary embodiments, the particular solvent used may depend on the filling material (e.g., polymer) in question. For example, it is desirable to use a polar solvent for a polar filling material. In further exemplary embodiments, the exposed surface of the dielectric material is dried prior to deposition of the hardmask. As non-limiting examples, the surface can be dried by blowing air or nitrogen over the surface. As another non-limiting example, the surface can be dried with a thermal removal. The exemplary solvent wash technique enables one to obtain a clean low-k surface (e.g., compatible with integration) while maintaining integrity of the low-k material (e.g., without damaging it) and integrity of the filled pores (e.g., without damaging them or causing the removal of the filling material from the pores).

Figure 12:
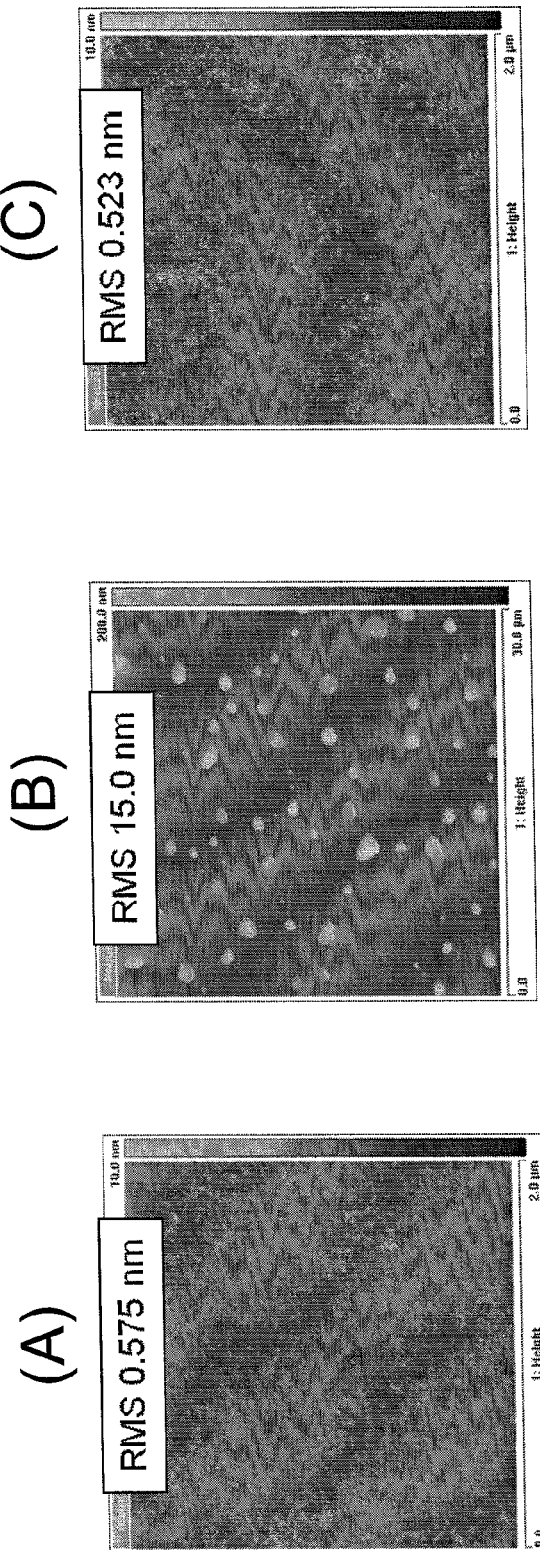
FIG. 12 shows three different analyses of surfaces of dielectric materials using atomic force microscopy.

FIG. 12 shows three different analyses of surfaces of dielectric materials using atomic force microscopy (AFM). FIG. 12A shows an AFM scan of a dielectric material surface similar to the structure shown in FIG. 2 (i.e., with the porous dielectric exposed, the pores remaining as yet unfilled). FIG. 12B shows an AFM scan of a dielectric material surface similar to the structure shown in FIG. 10B (i.e., with portions of the residual material on the surface of the dielectric). FIG. 12C shows an AFM scan of a dielectric material surface similar to the structure shown in FIG. 11B (i.e., with complete or substantially complete removal of the residual filling material using a solvent wash). As can be seen by comparing these different AFM scans, the solvent wash yields a surface (FIG. 12C) that is similar (e.g., identical, equivalent) to that of the pristine dielectric (FIG. 12A).

Figure 13:
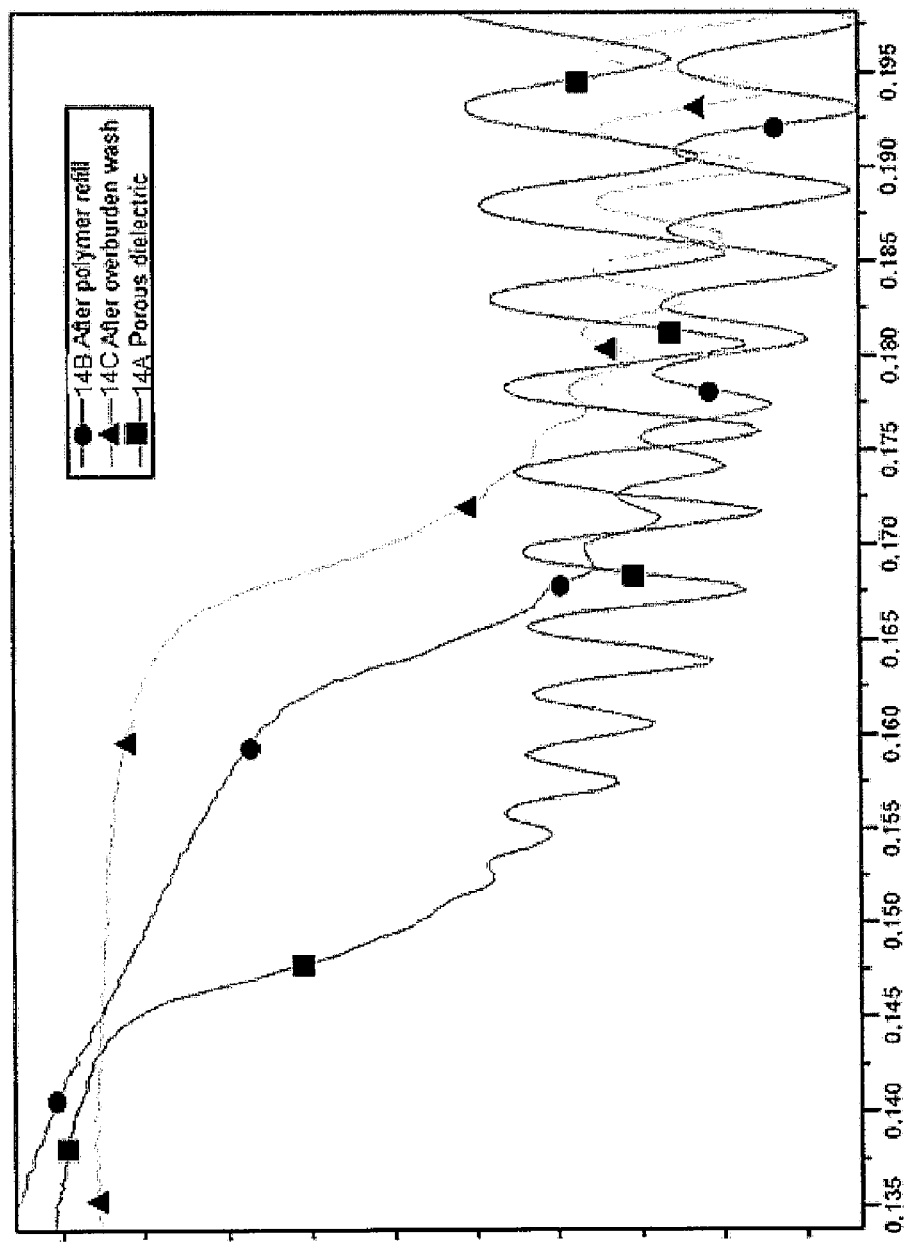
FIG. 13 shows x-ray reflectivity (XRR) scans for three top surfaces of dielectric materials.

FIG. 13 shows x-ray reflectivity (XRR) scans for the three top surfaces of the dielectric materials presented in FIG. 12. It should be noted that symbols on the lines (i.e., the squares, circles and triangles) are merely indicia used in order to identify the three lines (i.e., lines 13A, 13B and 13C, respectively). The symbols do not represent specific data points in and of themselves. The XRR scans of FIG. 13 show a plot of intensity versus angle. The critical angle for each XRR scan is the angle at which the intensity drops. This directly correlates to the density of the surface in question.

In FIG. 13, line 13A (squares) corresponds to the structure of FIG. 2 (i.e., the exposed surface of the porous dielectric prior to the pores being filled with the filling material) and the AFM scan in FIG. 12A. In FIG. 13, line 13B (circles) corresponds to the structure of FIG. 10B (i.e., the top surface of the structure with portions of the residual material on the surface of the dielectric) and the AFM scan in FIG. 12B. In FIG. 13, line 13C (triangles) corresponds to the structure of FIG. 11B (i.e., the top surface of the structure with complete or substantially complete removal of the residual filling material using a solvent wash) and the AFM scan in FIG. 12C.

As shown in FIG. 13, the unfilled porous material (13A) has the smallest critical angle. The structure with portions of the residual material on the surface (13B) has a higher critical angle than the unfilled porous material but not as high as the solvent washed-surface (13C). This is due to the fact that the critical angle depends on the density of the surface, and the density of the porous dielectric is less than that of the polymer which is less than that of the polymer filled dielectric.

FIG. 14 shows three tables (14A, 14B, 14C) corresponding to data obtained based on the three XRR scans (13A, 13B, 13C, respectively) of FIG. 13. The column labeled "$\rho_{filled}$" indicates normalized density (normalized to the density of the non-filled porous dielectric in FIG. 14A, see below). The column labeled "t" indicates the thickness (nm) of the various layers. The column labeled "Fill" indicates the pore filling (fractional) for various layers of the porous dielectric. The Fill value is obtained by solving the following equation:

$$\rho_{filled} = \rho_{low-k} + (\rho_{polymer} * \text{Fill} * \text{porosity})$$

The data of table 14A illustrates a single layer fit of XRR data for porous, low-k material on a substrate. That is, 14A has a single layer of 530 nm thickness (t) with a density ($\rho$) of 0.98. Note that the density calculations of FIG. 14 are normalized to this measure. The data of table 14B is a multilayer fit of XRR data showing four layers so identified by row number 14B-#: (14B-1) a thin layer of residual polymer; (14B-2) and (14B-3) two layers of similar density and fill indicating the majority of the porous, low-k dielectric is filled; and (14B-4) a thin layer of low-k dielectric close to the substrate that has comparatively low pore filling (10%). The data of table 14C is a multilayer fit of XRR data showing three layers so identified by row number 14C-#: (14C-2) and (14C-3) two layers of similar density and fill indicating the majority of the porous, low-k dielectric is filled; and (14C-4) a thin layer of low-k dielectric close to the substrate that has comparatively low pore filling (20%). The empty row in table 14C (row 14C-1) is included to show that the XRR scan indicates the absence of residual polymer on the surface (i.e., unlike table 14B). It is further noted that the total thickness of the structure for table 14C is 529 nm, similar to the total thickness for table 14A (530 nm), whereas the total thickness for table 14B is 541 nm.

Non-limiting examples of suitable solvents that may be utilized in conjunction with the above-described solvent wash include: alcohols (e.g., methanol, ethanol, propanol, isopropanol, 1-methoxy-2-propanol (PMOH), 1-propoxy-2-propanol); ethers (e.g., propylene glycol monomethyl ether acetate (PGMEA)); aromatic solvents (e.g., toluene, xylenes); alkanes, cycloalkanes (e.g., cyclohexane); esters (e.g., ethyl acetate, γ-butyrolactone); ketones (e.g., methyl ethyl ketone); water; and combinations thereof.

Various exemplary embodiments of the invention relate to methods and techniques for fabrication of semiconductor structures (e.g., interconnect structures) that can be employed in a microelectronic device, such as: high speed microprocessors, application specific integrated circuits (ASICs), and memory devices, as non-limiting examples. As a non-limiting example, the exemplary interconnect structures may comprise at least one conductive feature, formed on a substrate, with the substrate further comprising at least one insulating layer surrounding the at least one conductive feature. For example, the at least one insulating layer may surround the at least one conductive feature at its bottom and lateral surfaces. The exemplary structure further may comprise at least one conductive barrier layer disposed for at least one interface between the at least one insulating layer and the at least one conductive feature. In some exemplary embodiments, the combination of the at least one conductive feature and the at least one insulating layer may be repeated to form a multilevel interconnect stack. The exemplary interconnect structure may comprise a silicon wafer containing microelectronic devices, a ceramic chip carrier, an organic chip carrier, a glass substrate, a GaAs, SiC or other semiconductor wafer, a circuit board or a plastic substrate, as non-limiting examples.

Another exemplary embodiment of the invention provides a method for forming a porous dielectric material layer in an electronic structure by first providing an electronic structure that has devices built on top, depositing a layer of a porous dielectric material layer that has reached its maximum shrinkage on top of the electronic structure, and then filling the pores with a thermally labile material, removing the residual thermally labile material using a solvent wash, patterning the layer in a reactive ion etching process, removing the photoresist, depositing the liner, filling the structure with metallic copper, removing the excess of copper and hard-mask using chemical mechanical polishing and then annealing the electronic structure at a temperature not less than the volatilization temperature of the thermally labile material to regenerate the porosity of the porous dielectric material.

Another exemplary embodiment of the invention provides a method for forming a porous dielectric material layer in an electronic structure by first providing an electronic structure that has devices built on top, depositing a layer of a porous dielectric material layer that has reached its maximum shrinkage on top of the electronic structure, and then filling the pores with a thermally labile material, removing the residual thermally labile material using a solvent wash, patterning the layer in a reactive ion etching process, removing the photoresist, annealing the electronic structure at a temperature not less than the volatilization temperature of the thermally labile material to regenerate the porosity of the porous dielectric material, depositing the liner, filling the structure with metallic copper, and then removing the excess of copper and hard-mask using chemical mechanical polishing.

In the above-described other exemplary embodiment, note that the residual filling material (the excess thermally labile material) is removed prior to at least some other steps being performed (e.g., patterning, patterning with reactive ion etch, anneal, metal deposition, chemical mechanical polish). In further exemplary embodiments, the residual filling material may be removed at any suitable point in the process. For example, the residual filling material may be removed prior to or subsequent to any of the above-noted steps or processes (e.g., patterning, patterning with reactive ion etch, anneal, metal deposition, chemical mechanical polish).

In some exemplary embodiments, the filling material comprises an organic thermally labile material which has a decomposition temperature higher than the temperatures used during at least one of (and possibly all of): hard-mask deposition, lithography, reactive ion etch, photoresist strip, liner deposition, copper seed and plate and CMP. As an example, the organic thermally labile material may have a decomposition temperature between 300° C. and 425° C. or +400° C. In some exemplary embodiments, (e.g., maximum) filling may be obtained by heating the structure for about or less than 5 minutes.

In accordance with the exemplary embodiments of the invention, structures can be built with porous low-k materials such as silicate materials (e.g., silica, hydrogensilsesquioxane, methylsilsesquioxane, oxycarbosilane and copolymers thereof), as a non-limiting example. In some exemplary embodiments, the porosity is interconnected to ensure a good filling of the pores with the polymeric material. This is generally the case for porosity >25%. The problems encountered in the conventional prior art damascene method are solved by taking advantage of the nonporous nature of the pores filled dielectric material during processing steps, thus preventing any damage to the porous structure during integration.

In many cases, current low dielectric constant materials considered for k<2.4 are first deposited with a chemical composition containing a silicate or an organosilicate and various amounts of a second phase polymeric material, which is a pore-forming agent, referred to as "porogen" in the art. These composite materials are then made into a porous film with a dielectric constant in a range between about 1.4 and about 2.4 after removing the porogen phase. The word "about" used in this writing indicates a range of values. For example, such an exemplary range may be of +/−10% from the average value given. The second phase polymeric material, or the pore forming agent, is a material that is usually a long chained organic polymer which can be decomposed and volatilized and driven from the matrix material, i.e. the organosilicate, after the film has been cured in a curing process, for example.

As non-limiting examples, the weight average molecular weight of the organic polymeric materials used to fill the pores may be below 10,000 g/mol, preferably below 5,000 g/mol to enable full penetration into the porous structure. Examples of suitable decomposable polymers are described herein.

In some exemplary embodiments, the filling material may comprise a low molecular weight material. As an example, a low molecular weight may be considered to correspond to a molecular weight of the material (e.g., a polymer) between about 100 g/mol and about 5,000 g/mol. Polymers may be synthesized in a wide range of molecular weights and, thus, any suitable polymer may be utilized in conjunction with the exemplary embodiments of the invention. For example, polystyrene may be synthesized with a molecular weight ranging from 100 to 20,000,000 g/mol or more.

It is noted that the temperature for the fill may depend, at least in part, on the nature (composition) of the porous material. For example, if the surface of the porous material has a good affinity for the filling material (e.g., a polymer), the penetration temperature will be lower since less energy is needed to drive the filling material into the pores.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 15:
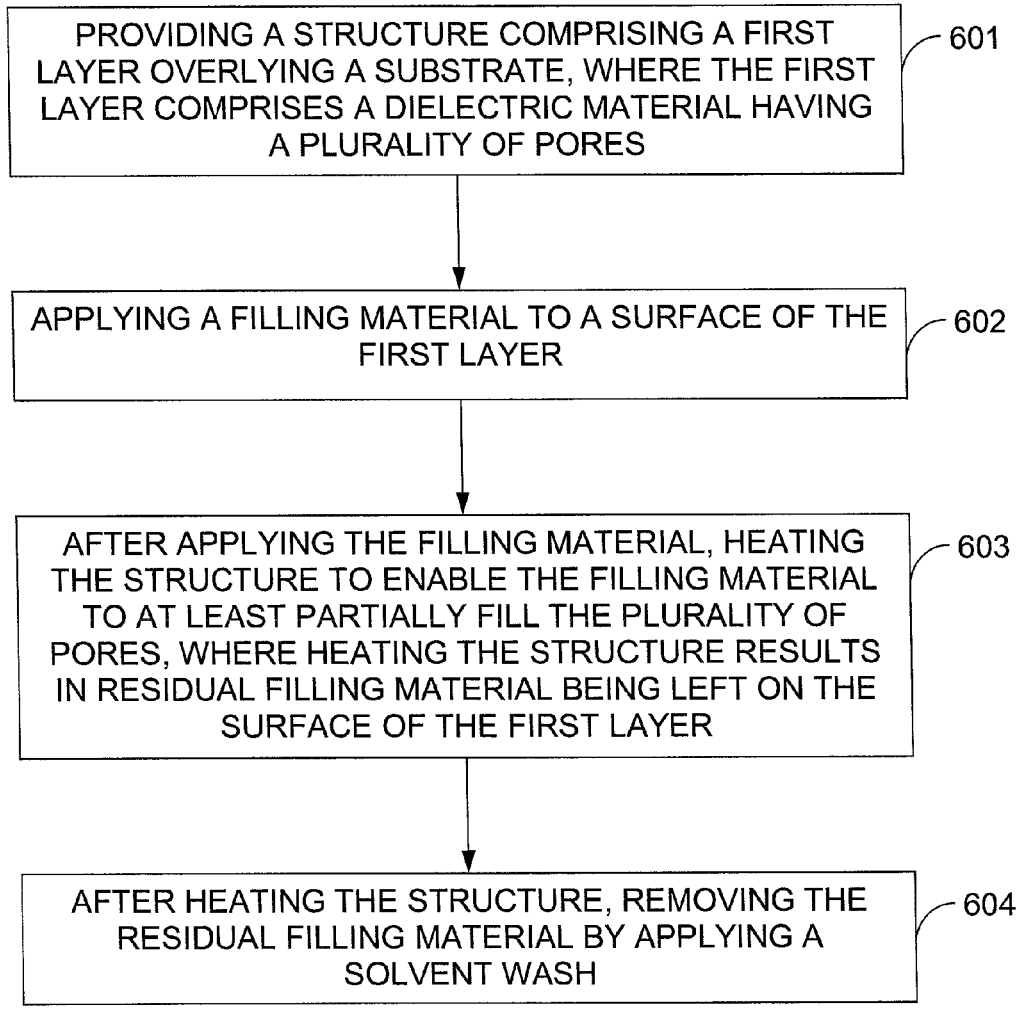
FIGS. 15 and 16 depict flowcharts illustrating non-limiting examples of methods for practicing the exemplary embodiments of this invention.

(1) In one exemplary embodiment of the invention, and as shown in FIG. 15, a method comprising: providing a structure comprising a first layer overlying a substrate, where the first layer comprises a dielectric material having a plurality of pores (601); applying a filling material to a surface of the first layer (602); after applying the filling material, heating the structure to enable the filling material to at least partially fill the plurality of pores, where heating the structure results in residual filling material being left on the surface of the first layer (603); and after heating the structure, removing the residual filling material by applying a solvent wash (604).

A method as above, where the residual filling material is substantially or completely removed by application of the solvent wash. A method as in any above, where the solvent wash does not remove the filling material from the plurality of pores. A method as in any above, where the solvent wash does not (affect or) interact with the first layer. A method as in any above, where the filling material comprises a polymer and the solvent wash comprises a theta solvent of the polymer. A method as in any above, where the solvent has a poor affinity for (a matrix of) the first layer. A method as in any above, where a temperature for the application of the solvent wash is controlled to mitigate or avoid erosion of the filling material from the plurality of pores. A method as in any above, where an exposure time for the application of the solvent wash is controlled to mitigate or avoid erosion of the filling material from the plurality of pores. A method as in any above, where at least one of a temperature and an exposure time for the application of the solvent wash is controlled to mitigate or avoid erosion of the filling material from the plurality of pores.

A method as in any above, further comprising: after heating the structure to enable the filling material to at least partially fill the plurality of pores, cooling the structure prior to removing the residual filling material. A method as in any above, further comprising: prior to removing the residual filling material by applying the solvent wash, selecting at least one component (e.g., at least one solvent) of the solvent wash (e.g., selecting a solvent of the solvent wash) based on the filling material. A method as in any above, where a composition of the solvent wash is selected based on a composition of the filling material. A method as in any above, where the filling material comprises a polar filling material and the solvent wash comprises a polar solvent. A method as in any above, where the filling material comprises a non-polar filling material and the solvent wash comprises a non-polar solvent. A method as in any above, further comprising: after applying the solvent wash, drying the surface of the first layer. A method as in any above, where drying the surface of the first layer comprises blowing a gas (e.g., air, nitrogen, an inert gas) over the surface of the first layer. A method as in any above, where drying the surface of the first layer comprises heating the film.

A method as in any above, where the solvent wash comprises at least one of: alcohols (e.g., methanol, ethanol, propanol, isopropanol, 1-methoxy-2-propanol (PMOH), 1-propoxy-2-propanol), ethers (e.g., propylene glycol monomethyl ether acetate (PGMEA)), aromatic solvents (e.g., toluene, xylenes), alkanes, cycloalkanes (e.g., cyclohexane), esters (e.g., ethyl acetate, γ-butyrolactone), ketones (e.g., methyl ethyl ketone) and water. A method as in any above, where the filling material comprises an organic thermally labile material. A method as in any above, where the filling material comprises an organic thermally labile material which has a decomposition temperature higher than the temperatures used during at least one of: hard-mask deposition, lithography, reactive ion etch, photoresist strip, liner deposition, copper seed and plate and chemical mechanical polishing. A method as in any above, where the filling material comprises an organic thermally labile material that has a decomposition temperature between about 300° C. and about 425° C. A method as in any above, where the filling material comprises an organic thermally labile material that has a decomposition temperature greater than 400° C. A method as in any above, where the dielectric material has a dielectric constant (k) less than or equal to 2.4.

A method as in any above, further comprising: after heating the structure to enable the filling material to at least partially fill the plurality of pores, chilling the structure to a temperature below room temperature prior to removing the residual filling material. A method as in any above, where the solvent wash comprises at least one of: an alcohol, methanol, ethanol, propanol, isopropanol, 1-methoxy-2-propanol (PMOH), 1-propoxy-2-propanol, an ether, propylene glycol monomethyl ether acetate (PGMEA), an aromatic solvent, toluene, a xylene, an alkane, a cycloalkane, cyclohexane, an ester, ethyl acetate, γ-butyrolactone, a ketone, methyl ethyl ketone, and water. A method as in any above, further comprising: after heating the structure to enable the filling material to at least partially fill the plurality of pores, cooling the structure to room temperature or chilling the structure to a temperature below room temperature prior to removing the residual filling material.

A method as in any above, implemented as a computer program. A method as in any above, implemented as a program of instructions stored (e.g., tangibly embodied) on a program storage device (e.g., at least one memory, at least one computer-readable medium) and executable by a computer (e.g., at least one processor). A method as in any above, further comprising one or more aspects of the exemplary embodiments of the invention as described further herein.

(2) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores (601); applying a filling material to a surface of the first layer (602); after applying the filling material, heating the structure to enable the filling material to at least partially fill the plurality of pores, where heating the structure results in residual filling material being left on the surface of the first layer (603); and after heating the structure, removing the residual filling material by applying a solvent wash (604).

A program storage device as in any above, where the program storage device comprises a at least one memory or at least one computer-readable medium. A program storage device as in any above, where the machine comprises a computer or at least one processor configured to execute the program of instructions. A program storage device as in any above, further comprising one or more aspects of the exemplary embodiments of the invention as described further herein.

Figure 16:
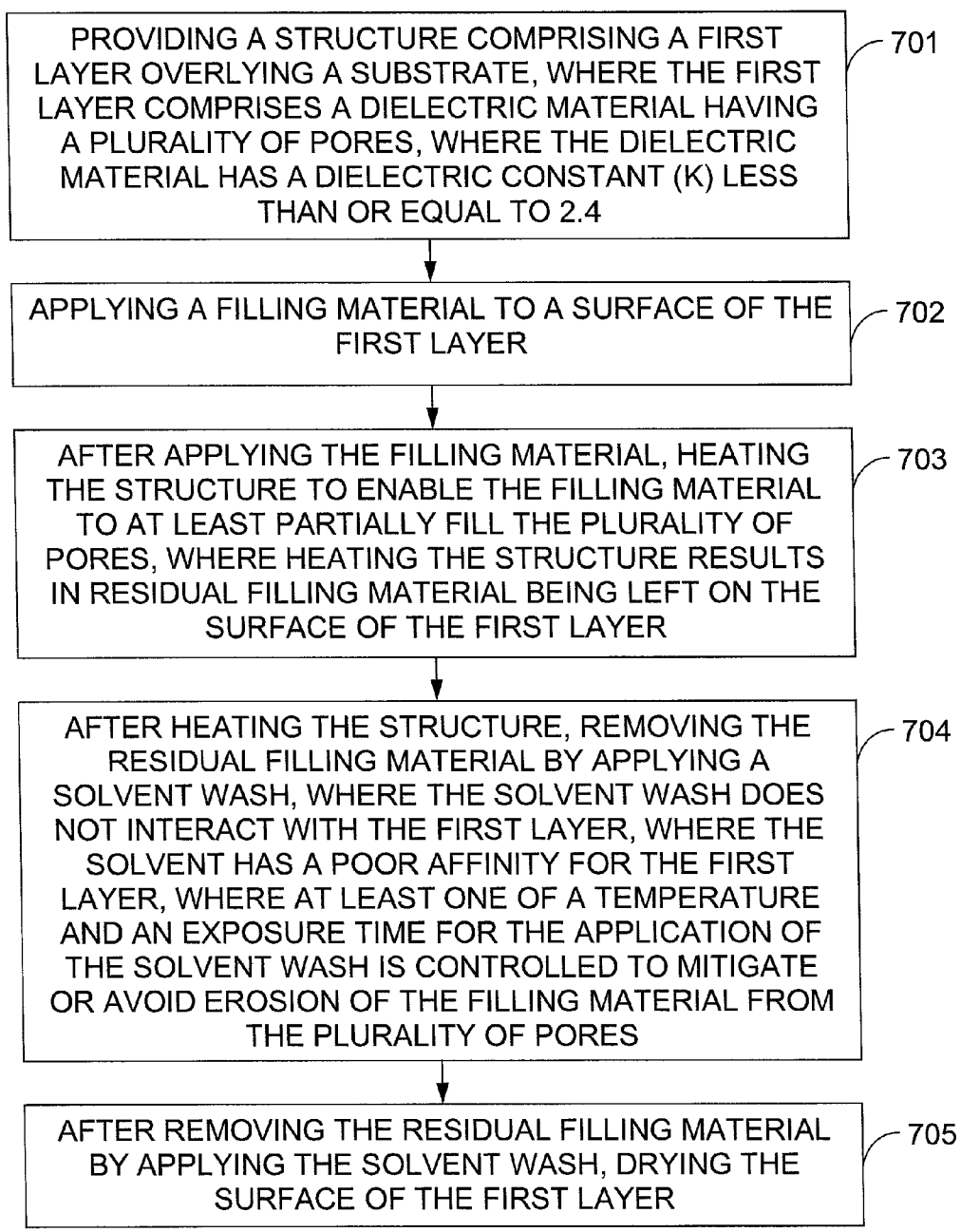

(3) In a further exemplary embodiment of the invention, and as shown in FIG. 16, a method comprising: providing a structure comprising a first layer overlying a substrate, where the first layer comprises a dielectric material having a plurality of pores, where the dielectric material has a dielectric constant (k) less than or equal to 2.4 (701); applying a filling material to a surface of the first layer (702); after applying the filling material, heating the structure to enable the filling material to at least partially fill the plurality of pores, where heating the structure results in residual filling material being left on the surface of the first layer (703); after heating the structure, removing the residual filling material by applying a solvent wash, where the solvent wash does not interact with the first layer, where the solvent has a poor affinity for the first layer, where at least one of a temperature and an exposure time for the application of the solvent wash is controlled to mitigate or avoid erosion of the filling material from the plurality of pores (704); and after removing the residual filling material by applying the solvent wash, drying the surface of the first layer (705).

A method as in any above, implemented as a computer program. A method as in any above, implemented as a program of instructions stored (e.g., tangibly embodied) on a program storage device (e.g., at least one memory, at least one computer-readable medium) and executable by a computer (e.g., at least one processor). A method as in any above, further comprising one or more aspects of the exemplary embodiments of the invention as described further herein.

(4) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores, where the dielectric material has a dielectric constant (k) less than or equal to 2.4 (701); applying a filling material to a surface of the first layer (702); after applying the filling material, heating the structure to enable the filling material to at least partially fill the plurality of pores, where heating the structure results in residual filling material being left on the surface of the first layer (703); after heating the structure, removing the residual filling material by applying a solvent wash, where the solvent wash does not interact with the first layer, where the solvent has a poor affinity for the first layer, where at least one of a temperature and an exposure time for the application of the solvent wash is controlled to mitigate or avoid erosion of the filling material from the plurality of pores (704); and after removing the residual filling material by applying the solvent wash, drying the surface of the first layer (705).

A program storage device as in any above, where the program storage device comprises a at least one memory or at least one computer-readable medium. A program storage device as in any above, where the machine comprises a computer or at least one processor configured to execute the program of instructions. A program storage device as in any above, further comprising one or more aspects of the exemplary embodiments of the invention as described further herein.

(5A) In a further exemplary embodiment of the invention, a method for forming a porous dielectric material with the pores filled by a polymer (e.g., and no excess/residual polymer on top of the material) comprising the steps of: providing a pre-processed substrate; forming thereon a layer of fully cured first porous dielectric material; filling the pores in said cured porous dielectric with a polymer to render the dielectric nonporous; washing the excess polymer on top of the porous layer with a solvent; and drying the solvent on top of the dielectric, thus obtaining a top surface equivalent to that of the original fully cured porous dielectric material.

(5B) A method for forming said porous dielectric material according to clause 5A, wherein said first porous dielectric material is substantially made of silicon containing dielectrics selected from the group comprising silicon oxide, methylsilsesquioxane, hydrogensilsesquioxane, oxycarbosilanes and copolymers thereof.

(5C) A method for forming said filled porous dielectric material according to clause 5A, wherein said organic polymer used for filling pores in said first porous dielectric is selected from the group comprising poly(2-alkyl oxazolines), poly(N,N-dialkylacrylamides), poly(caprolactones), polyesters, polyactides, polystyrenes, substituted polystyrenes, poly-alpha methylstyrene, substituted poly-alpha methyl polystyrenes, aliphatic polyolefins, polynorbornenes, polyacrylates, polymethacrylates, and polyethers. Among the latter, particularly polyethylene oxide, polypropylene oxide and polytetrahydrofuran also may be used.

(5D) A method for filling pores in said porous dielectric material according to clause 5A with said polymer according to clause 5B by: dissolving the polymer in a solvent and allowing the said solution to penetrate by capillarity in the porous dielectric then drying the solvent thus leaving the polymer in the porous dielectric; and coating the polymer on top of the porous dielectric then heating it above its glass transition temperature (Tg) to allow it to penetrate by capillarity in the porous dielectric and then cooling the system.

(5E) A method for washing the excess polymer on top of the polymer filled dielectric material according to clause 5B by removing the excess polymer with an adequate solvent.

The said is solvent is selected from the group comprising alcohols (e.g., methanol, ethanol, propanol, isopropanol, 1-methoxy-2-propanol (PMOH), 1-propoxy-2-propanol), ethers (e.g., propylene glycol monomethyl ether acetate (PG-MEA)), aromatic solvents (e.g., toluene, xylenes), alkanes, cycloalkanes (e.g., cyclohexane), esters (e.g., ethyl acetate, γ-butyrolactone), ketones (e.g., methyl ethyl ketone), water and combinations thereof.

(5F) A method for removing the excess of the said solvent in clause 5E after washing the excess of the said polymer in clause 5C off the said dielectric material in clause 5B by: spinning the system, submitting the system to a flow of gas, heating the system, or putting the system under vacuum.

The exemplary embodiments of the invention, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise steps of utilizing the exemplary embodiments or steps of the method.

The blocks shown in FIGS. 15 and 16 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 15 and 16 should be considered merely exemplary and non-limiting. It should be appreciated that the blocks shown in FIGS. 15 and 16 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 15 and 16 so as to implement one or more further exemplary embodiments of the invention.

That is, the exemplary embodiments of the invention shown in FIGS. 15 and 16 may be utilized, implemented or practiced in conjunction with one or more further aspects in any combination (e.g., any combination that is suitable, practicable and/or feasible) and are not limited only to the steps, blocks, operations and/or functions shown in FIGS. 15 and 16.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
providing a structure comprising a first layer overlying a substrate, where the first layer comprises a dielectric material having a plurality of pores;
applying a filling material to a surface of the first layer;
after applying the filling material, heating the structure to enable the filling material to at least partially fill the plurality of pores, where heating the structure results in residual filling material being left on the surface of the first layer and forming an overburden layer;
after heating the structure to enable the filling material to at least partially fill the plurality of pores, chilling the structure to a temperature below room temperature;
removing the overburden layer by applying a solvent wash, the removing of the overburden layer being based on a difference in solubilities of the filling material in the plurality of pores and the overburden layer; and
thereafter, removing the filling material from the plurality of the pores.

2. The method of claim 1, where the dielectric material has a dielectric constant (k) less than or equal to 2.4.

3. The method of claim 1, where the solvent wash comprises at least one of: an alcohol, methanol, ethanol, propanol, isopropanol, 1-methoxy-2-propanol (PMOH), 1-propoxy-2-propanol, an ether, propylene glycol monomethyl ether acetate (PGMEA), an aromatic solvent, toluene, a xylene, an alkane, a cycloalkane, cyclohexane, an ester, ethyl acetate, γ-butyrolactone, a ketone, methyl ethyl ketone, and water.

4. The method of claim 1, where the residual filling material is substantially or completely removed by application of the solvent wash.

5. The method of claim 1, where the solvent wash does not remove the filling material from the plurality of pores.

6. The method of claim 1, where the filling material comprises a polymer and the solvent wash comprises a theta solvent of the polymer.

7. The method of claim 1, where the filling material comprises a polar filling material and the solvent wash comprises a polar solvent.

8. The method of claim 1, where the filling material comprises a non-polar filling material and the solvent wash comprises a non-polar solvent.

9. The method of claim 1, where a composition of the solvent wash is selected based on a composition of the filling material.

10. The method of claim 1, where the solvent wash does not interact with the first layer.

11. The method of claim 1, where a temperature for the application of the solvent wash is controlled to mitigate or avoid erosion of the filling material from the plurality of pores.

12. The method of claim 1, where an exposure time for the application of the solvent wash is controlled to mitigate or avoid erosion of the filling material from the plurality of pores.

13. The method of claim 1, further comprising: after applying the solvent wash, drying the surface of the first layer.

14. A method comprising:
 providing a structure comprising a first layer overlying a substrate, where the first layer comprises a dielectric material having a plurality of pores, where the dielectric material has a dielectric constant (k) less than or equal to 2.4;
 applying a filling material to a surface of the first layer;
 after applying the filling material, heating the structure to enable the filling material to at least partially fill the plurality of pores, where heating the structure results in residual filling material being left on the surface of the first layer and forming an overburden layer;
 after heating the structure to enable the filling material to at least partially fill the plurality of pores, chilling the structure to a temperature below room temperature;
 after chilling the structure, removing the overburden layer by applying a solvent wash, the removal of the overburden layer being based on a difference in solubilities of the filling material in the plurality of pores and the overburden layer, where the solvent wash does not interact with the first layer, where the solvent has a poor affinity for the first layer, where at least one of a temperature and an exposure time for the application of the solvent wash is controlled to mitigate or avoid erosion of the filling material from the plurality of pores;
 after removing the overburden layer by applying the solvent wash, drying the surface of the first layer; and
 removing the filling material from the plurality of the pores.

15. The method of claim 14, where the residual filling material is substantially or completely removed by application of the solvent wash.

16. The method of claim 14, where the solvent wash does not remove the filling material from the plurality of pores.

* * * * *